United States Patent [19]

Woolverton

[11] Patent Number: 5,519,596
[45] Date of Patent: May 21, 1996

[54] MOLDABLE NESTING FRAME FOR LIGHT EMITTING DIODE ARRAY

[75] Inventor: Douglas P. Woolverton, San Jose, Calif.

[73] Assignee: Hewlett-Packard Company, Palo Alto, Calif.

[21] Appl. No.: 442,724

[22] Filed: May 16, 1995

[51] Int. Cl.⁶ .................................................. F21V 21/14
[52] U.S. Cl. .......................... 362/250; 362/252; 362/800
[58] Field of Search ..................................... 362/382, 250, 362/249, 221, 800, 419, 287, 418; 361/637, 639, 638

[56] References Cited

U.S. PATENT DOCUMENTS

| | | | |
|---|---|---|---|
| 4,439,818 | 3/1984 | Scheib | 362/250 |
| 5,018,055 | 5/1991 | Wu | 362/249 |
| 5,084,804 | 1/1992 | Schairer | 362/800 |
| 5,404,282 | 4/1995 | Klinke et al. | 362/800 |

FOREIGN PATENT DOCUMENTS 230050  1/1910  Germany ............................... 362/250

Primary Examiner—James C. Yeung
Attorney, Agent, or Firm—Jonathan B. Penn

[57] ABSTRACT

A module comprised of a plurality of light emitting diode ("LED") lamps or other light emitting devices and a metal nesting frame with flexible joints between each row of LED bus bars is described. The flexible joint between the rows of LED bus bars allows the module to be assembled flat, which eases its manufacture. After the LED lamps or other light emitting devices have been mounted on the nesting frame, the flexible joints allow the module to be formed to fit within or on a complex three dimensional space. After forming, the metal nesting frame is still rigid enough to support the finished module in the desired shape.

6 Claims, 5 Drawing Sheets

MOLDABLE NESTING FRAME FOR LIGHT EMITTING DIODE ARRAY

BACKGROUND OF THE INVENTION

This invention is in the field of light emitting diodes ("LED"s) and other light emitting semiconductor devices. In particular, the present invention relates to arrays of LEDs or other light emitting devices.

LEDs mounted on metal lead frames to form modules are known. An example of such a module is Klinke, et al., Multiple Light Emitting Diode Module, U.S. Pat. No. 5,404,282 ("Klinke"). The LEDs in that patent are mounted on a rigid metal lead frame to form a lighting module.

Klinke has one obvious limitation. As the metal lead frame is relatively rigid, the finished module forms a two dimensional plane, limiting its mounting options in three dimensional spaces. Even if the lead frame of Klinke were made thinner and therefore more flexible, bending it to fit a three dimensional space would result in the individual LEDs transmitting light in many different directions, greatly reducing the perceived brightness of the module from any fixed observation point. For example, if the Klinke module were bent to form the tail lights of an automobile, many of the LEDs mounted on the bent lead frame would not be transmitting their light directly rearward. As the perceived rearward brightness is critical for visibility and safety, the misdirection of light from the Klinke module, if it were bent to fit these spaces, would limit the module's usefulness.

Several possible solutions to this problem have been suggested. A metal lead frame pre-formed to the desired shape, with the mounting sites for each of the LEDs carefully pre-bent to direct light in the desired direction, is one possibility. However, mounting the LEDs on the lead frame after the lead frame is bent is very difficult and not easily adapted to mass manufacturing.

Fully flexible printed circuit boards are another possibility, but they are more costly than metal lead frames, do not conduct heat nearly as well as metal lead frames, and require a support structure to maintain the desired final shape.

A LED module which can be molded to fit complex three dimensional spaces, which directs each of its light emitting components in the same direction, and is self-supporting would be an improvement to the art. The module should also be easily manufactured.

SUMMARY OF THE INVENTION

The first preferred embodiment of the present invention comprises a metal nesting frame with flexible connecting joints between each pair of rigid bus bar rows. LED lamps or other light emitting devices can be mounted on the nesting frame while the nesting frame is flat, easing manufacture. After manufacture, the assembled module can be bent to the desired final configuration. The flexibility of the joint allows the module to be bent so that each row of LEDs is transmitting light in the same direction as every other row, allowing maximum light concentration. The ability to concentrate so much of the generated light in a desired direction would permit the use of fewer LEDs in the completed module. The heat flow benefits of using a metal frame are also retained.

The present invention will now be described in detail, with reference to the figures listed and described below.

DETAILED DESCRIPTION OF THE PREFERRED EMBODIMENT

Figure 1:
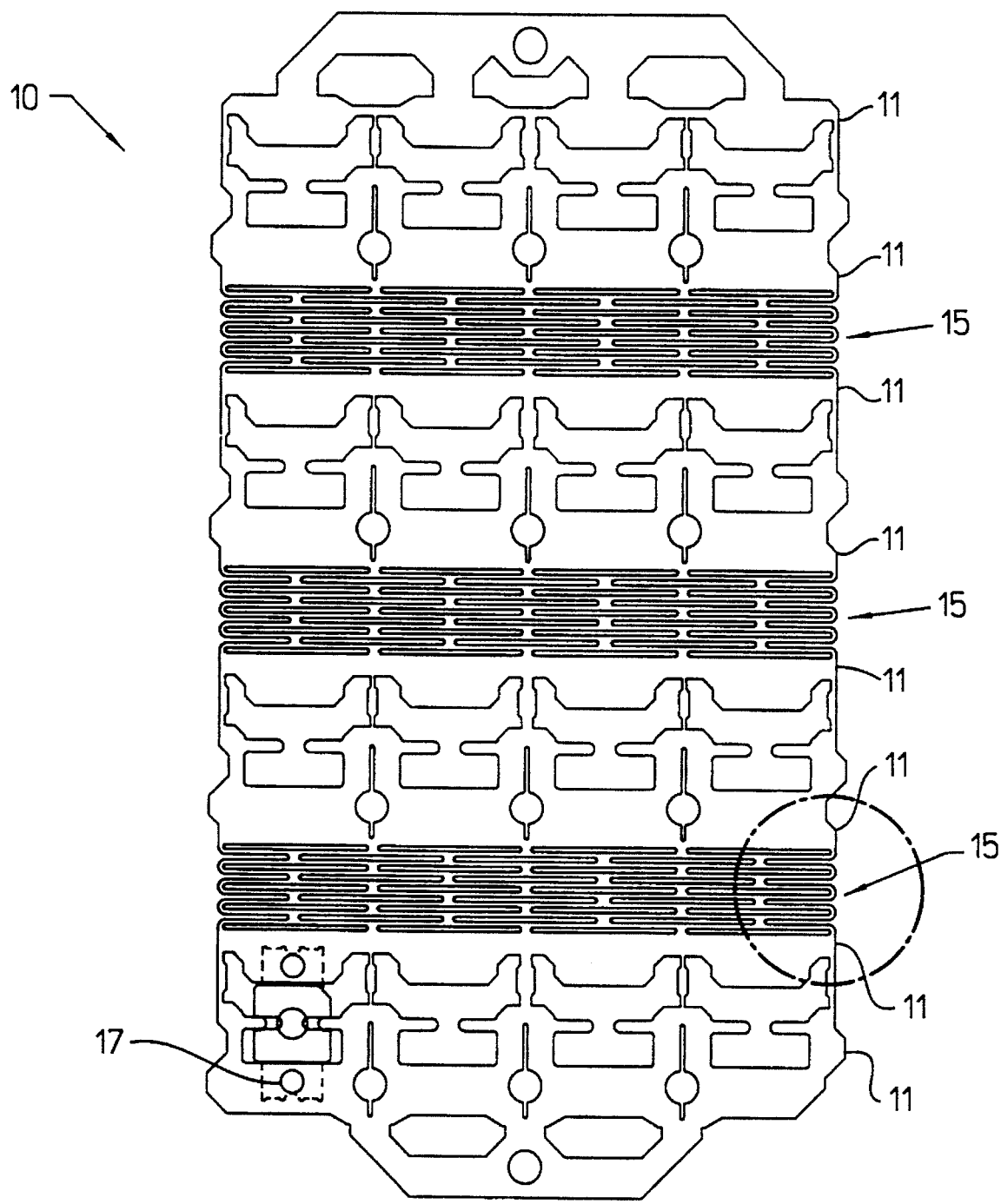
FIG. 1 is a top view of the first embodiment of the present invention.

A first preferred embodiment of the metal nesting frame that comprises a portion of the present invention is shown in FIG. 1. Nesting frame 10 has a plurality of bus bars 11 and flexible joints 15 which couple the bus bar pairs together. As shown by the shadow LED lamp 17 in FIG. 1, a plurality of LED lamps 17 are mounted on bus bars 11. In this preferred embodiment, clinching is used to couple the LED lamps to the bus bars. The exact method used to couple the LED lamps to the bus bar is not critical, as long as the final connection between the LED lamp and metal nesting frame is mechanically strong and electrically conductive.

Figure 2:
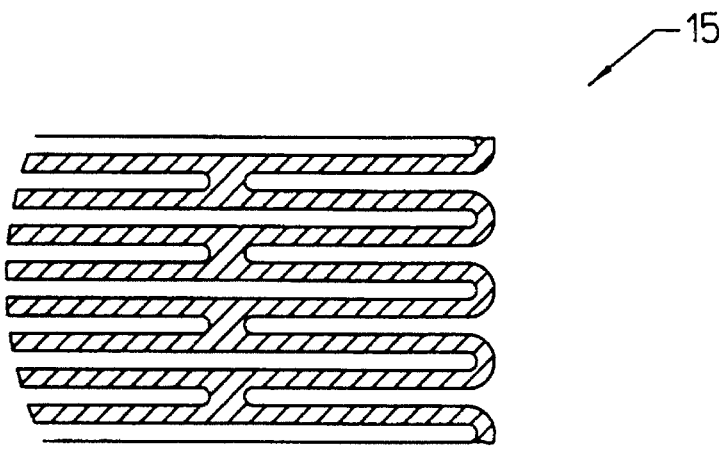
FIG. 2 is a detailed view of the flexible connection shown circled in FIG. 1.

FIG. 2 shows the circled flexible joint 15 of FIG. 1 in more detail. Joint 15 has a metal net-like form in this embodiment. The joint can be bent easily, allowing the pairs of bus bars to be separated both in the x-axis and the z-axis (see FIG. 4a for three dimensional vectors). The exact form of the joint itself, as long as it remains flexible and conductive, is not considered critical to the practice of the present invention.

Figure 3:
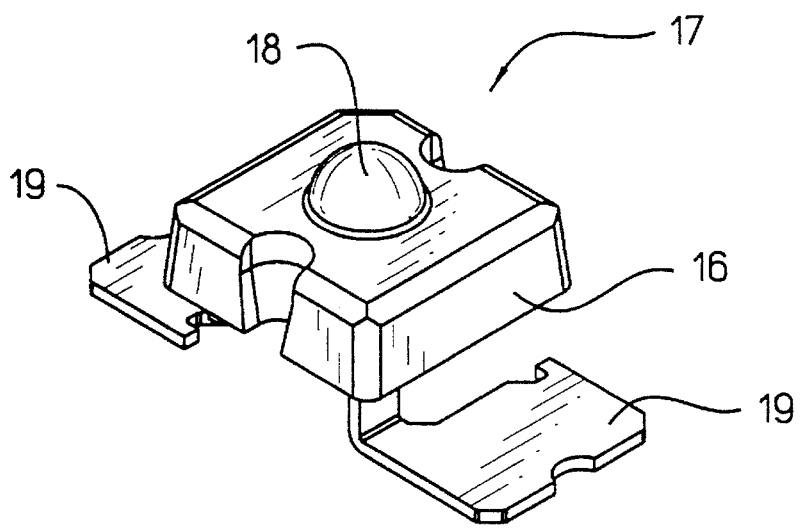
FIG. 3 is an isometric view of an LED lamp used in the first preferred embodiment of the present invention.

A known LED lamp, shown in FIG. 3, is used with this first embodiment of the present invention. LED lamp 17 has a generally square shape and a housing 16 with a cover lens 18, housing 16 containing the actual light emitting element (not shown). For purposes of this disclosure, mounting pads 19 are used to attached the LED lamp electrically and mechanically to metal nesting frame 10 (see FIG. 1). In this embodiment, a type of clinching is used to couple the LED lamp to the nesting frame, but other means such as soldering or spot-welding could also be used, as long as these methods did not exceed the heat sinking capacity of the LED lamp and metal nesting frame combination and provided a connection equally strong and as conductive as the one formed by clinching.

Figure 4A:
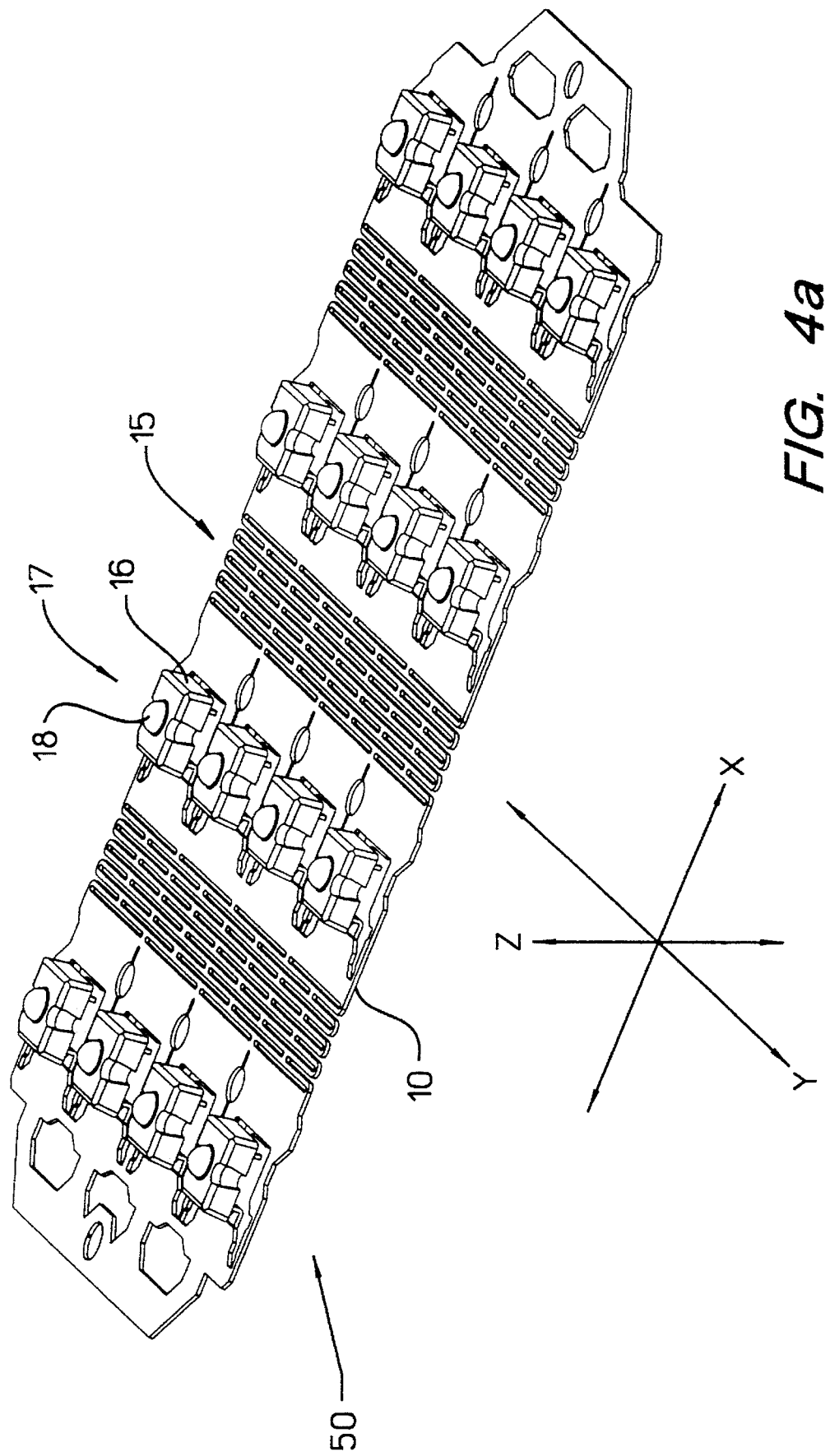
FIG. 4a shows the assembled first embodiment of the present invention, before three dimensional shaping.

A finished LED lamp module 50, before three dimensional shaping, is shown in FIG. 4a. The entire module is fabricated before metal nesting frame 10 is bent to fit its intended location. Only one module 50 is illustrated. In a finished installation, which would possibly comprise an automobile tail light, a plurality of modules 50 would be needed. Depending upon the desired installation, the final shape of module 50 can be created by either an automatic metal bending operation or a manual bending operation.

Figure 4B:
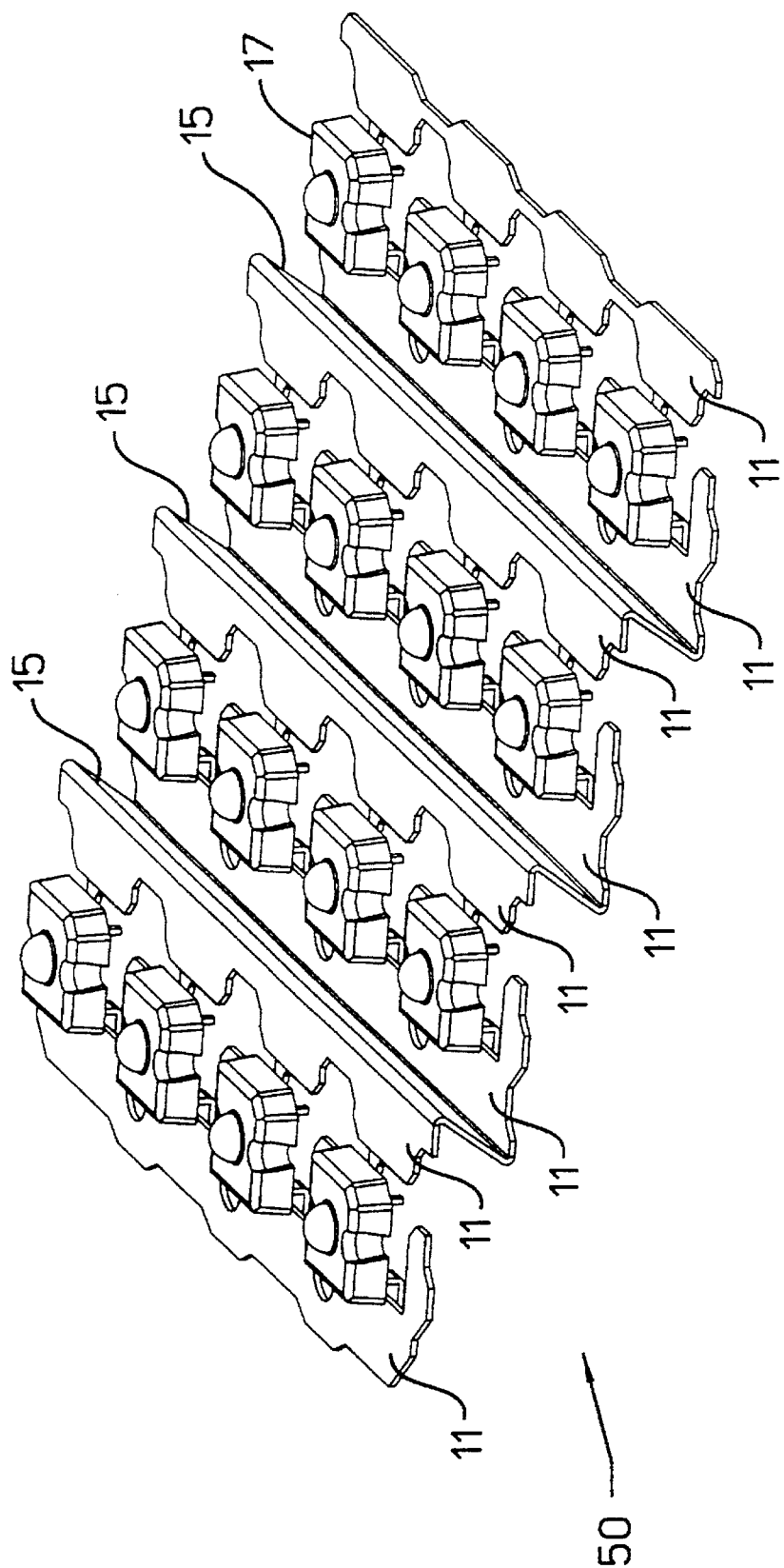
FIG. 4b shows the assembled first embodiment of the present invention, after three dimensional shaping.

FIG. 4b shows module 50 after three dimensional shaping. Flexible joints 15 have been bent so that module 50 takes the form of a staircase. Each row of LED lamps 17 remains parallel to one another, and each row of LED lamps 17 directs their light in the same direction.

Although the steps shown in FIG. 4b are roughly identical, nothing herein should be taken to limit the invention to that. Variable step sizes may be useful, and each flexible joint 15 can be bent differently from every other joint to form the desired step size. Indeed, the finished module could even be fanned in one direction or another, by differentially forming the step on both sides of the nesting frame.

Figure 5:
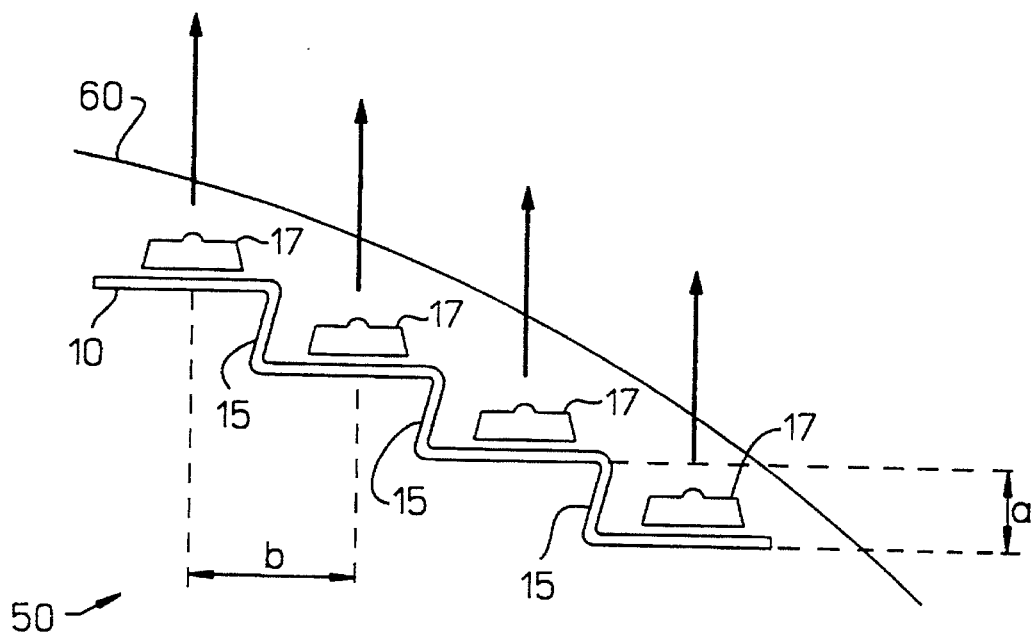
FIG. 5 is a side view showing the first embodiment after shaping.
Figure 6:
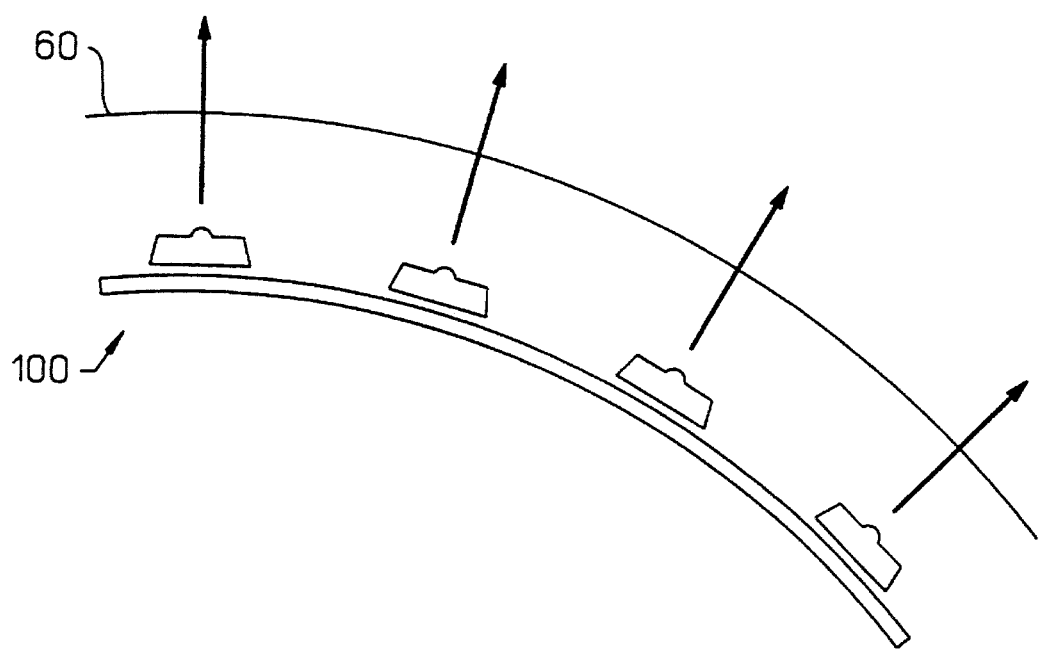
FIG. 6 is a side view of a known frame/LED lamp assembly after shaping(Prior Art).

FIGS. 5 and 6 show respectively the present invention bent to fit into one hypothetical housing and a known rigid module bent to fit into the same housing. By bending joints 15, module 50 can be fitted into tail light housing 60. A height "a" vertically separates each row of LED lamps and a distance "b" separates the centers of the LED lamps in successive rows of the module. All light from LED lamps 17 is directed in generally the same direction. As previously stated, height a and distance b can vary between each row of LED lamps. In this manner, nesting frame 10 and flexible joint 15 permit the finished module 50 to fit a wide variety of spaces.

When known LED module 100 is bent to fit into tail light housing 60, not only is a great deal of stress placed on its rigid lead frame, but the light from the LEDs mounted on module 100 is scattered in a plurality of directions.

The present invention provides a method for fabricating an LED module that can be assembled cheaply, which is easily bent to fit into a plurality of different installations, and which allows each of the LED lamps comprising the module to transmit its light in generally the same direction.

What is claimed is:

1. A metal nesting frame for a light emitting module comprising:

a plurality of bus bar pairs, a plurality of light emitting semiconductor devices being mounted on the bus bar pairs; and a mechanically compressible and expandable joint coupling each of the bus bar pairs together, electrically connecting the light emitting semiconductor devices.

2. A light emitting module for emitting light along an optical axis comprising:

a plurality of light emitting devices;

a metal nesting frame upon which the devices are mounted, the metal nesting frame further comprising bus bars which are mechanically and electrically coupled to the light emitting devices and at least one mechanically compressible and expandable joint electrically coupled to the bus bars.

3. The light emitting module of claim 2 wherein the at least one mechanically compressible and expandable joint allows the module to be bent to fit a three dimensional mounting space, the light from the light emitting devices being aimed along the optical axis.

4. The module of claim 2 wherein the at least one mechanically compressible and expandable joint forms a step between two pairs of bus bars, the step having a height and a width.

5. The module of claim 4 wherein a plurality of mechanically compressible and expandable joints form a plurality of steps, each step having a height and a width, the height and width of each step being independently variable.

6. The module of claim 2 wherein compression of the at least one mechanically compressible and expandable joint decreases the distance between light emitting devices in a plane perpendicular to the optical axis and expansion of the at least one mechanically compressible and expandable joint increases the distance between light emitting devices in a plane perpendicular to the optical axis.

* * * * *